(12) United States Patent
Wang et al.

(10) Patent No.: US 9,627,219 B2
(45) Date of Patent: Apr. 18, 2017

(54) CMP WAFER EDGE CONTROL OF DIELECTRIC

(71) Applicant: GLOBALFOUNDRIES Singapore Pte. Ltd., Singapore (SG)

(72) Inventors: Lei Wang, Singapore (SG); Xuesong Rao, Singapore (SG); Wei Lu, Singapore (SG); Alex See, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 25 days.

(21) Appl. No.: 14/253,874

(22) Filed: Apr. 16, 2014

(65) Prior Publication Data

US 2015/0303068 A1    Oct. 22, 2015

(51) Int. Cl.
*H01L 21/302* (2006.01)
*H01L 21/311* (2006.01)
*H01L 21/461* (2006.01)
*H01L 21/3105* (2006.01)
*H01L 21/762* (2006.01)
*H01L 21/02* (2006.01)

(52) U.S. Cl.
CPC .. *H01L 21/31055* (2013.01); *H01L 21/31053* (2013.01); *H01L 21/76256* (2013.01); *H01L 21/02271* (2013.01)

(58) Field of Classification Search
CPC ......... H01L 21/31053; H01L 21/31055; H01L 21/76256; H01L 21/02065; H01L 21/02271; H01L 21/02277; H01L 21/31051; H01L 21/31116; H01L 21/3212
USPC ........................................ 438/692, 697, 694
See application file for complete search history.

(56) References Cited

U.S. PATENT DOCUMENTS

| | | | |
|---|---|---|---|
| 6,271,138 B1* | 8/2001 | Chang | H01L 21/31053 216/88 |
| 2006/0191637 A1* | 8/2006 | Zajac | B81C 1/00547 156/345.34 |
| 2006/0228889 A1* | 10/2006 | Edelberg | G03F 7/427 438/689 |
| 2016/0064519 A1* | 3/2016 | Yang | H01L 21/02068 438/712 |

* cited by examiner

*Primary Examiner* — Shouxiang Hu
(74) *Attorney, Agent, or Firm* — Horizon IP Pte. Ltd.

(57) ABSTRACT

Methods of forming a semiconductor device are presented. The method includes providing a wafer with top and bottom wafer surfaces. The wafer includes edge and non-edge regions. A dielectric layer having a desired concave top surface is provided on the top wafer surface. The method includes planarizing the dielectric layer to form a planar top surface of the dielectric layer. The desired concave top surface of the dielectric layer thicknesses compensates for different planarizing rates at the edge and non-edge regions of the wafer.

21 Claims, 5 Drawing Sheets

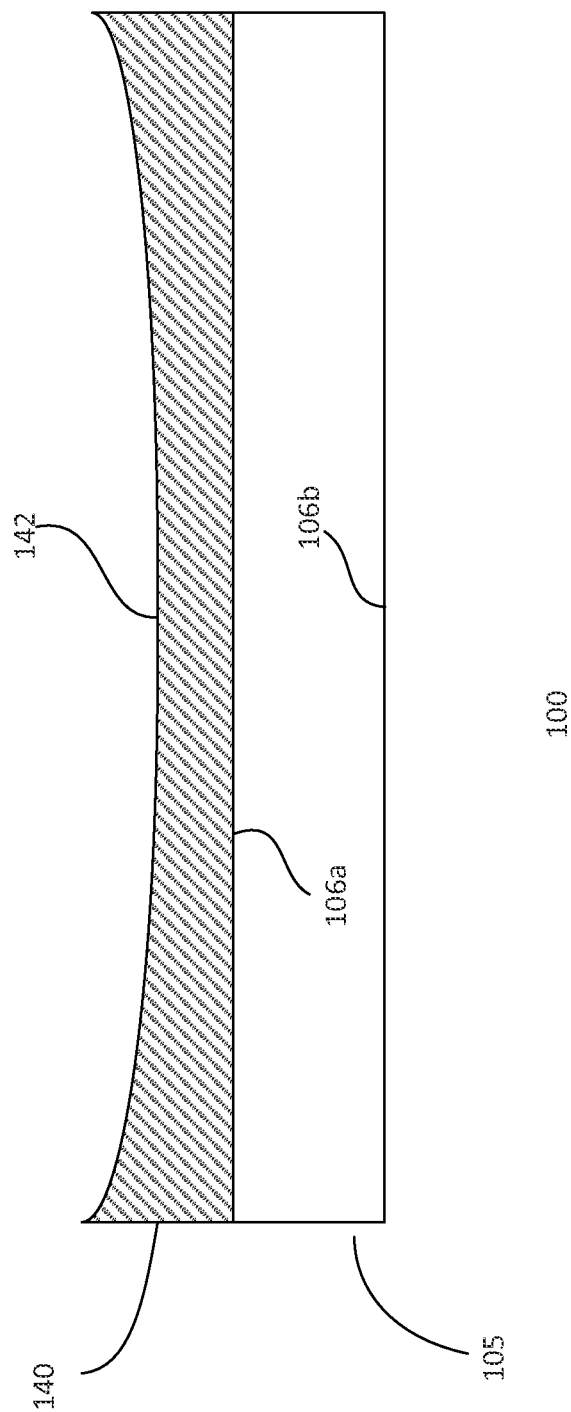

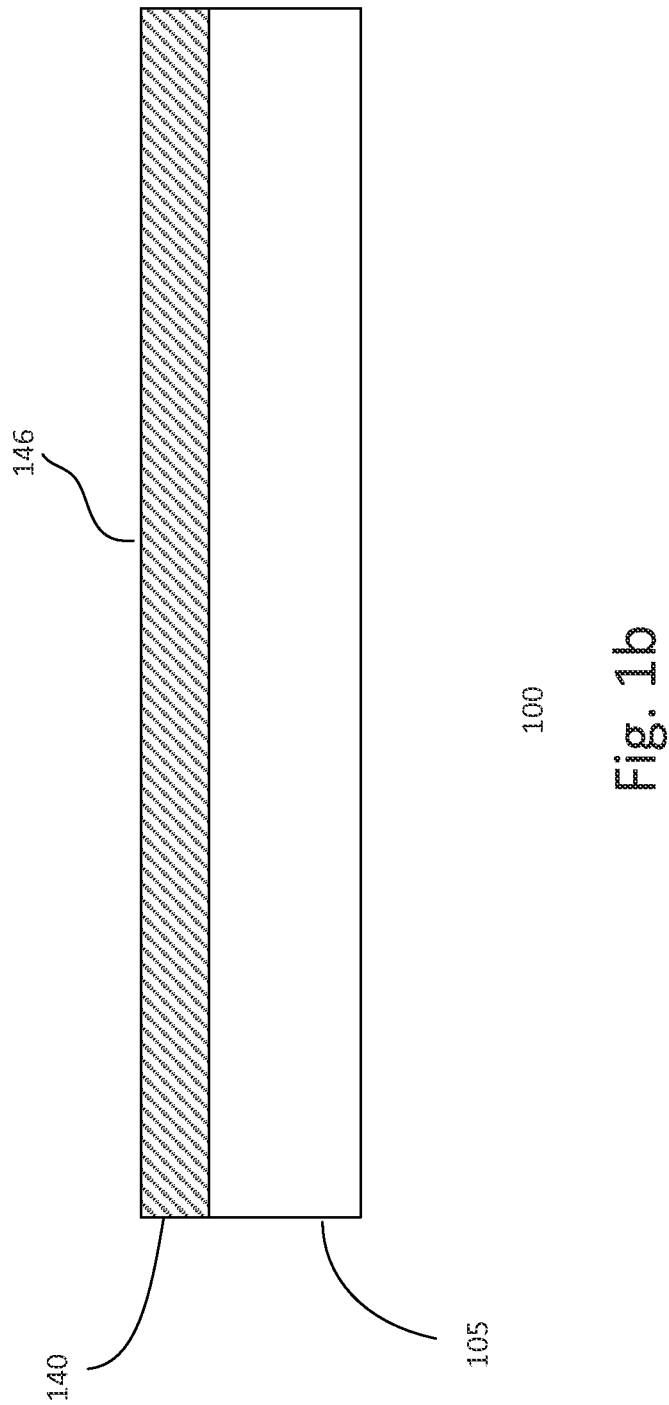

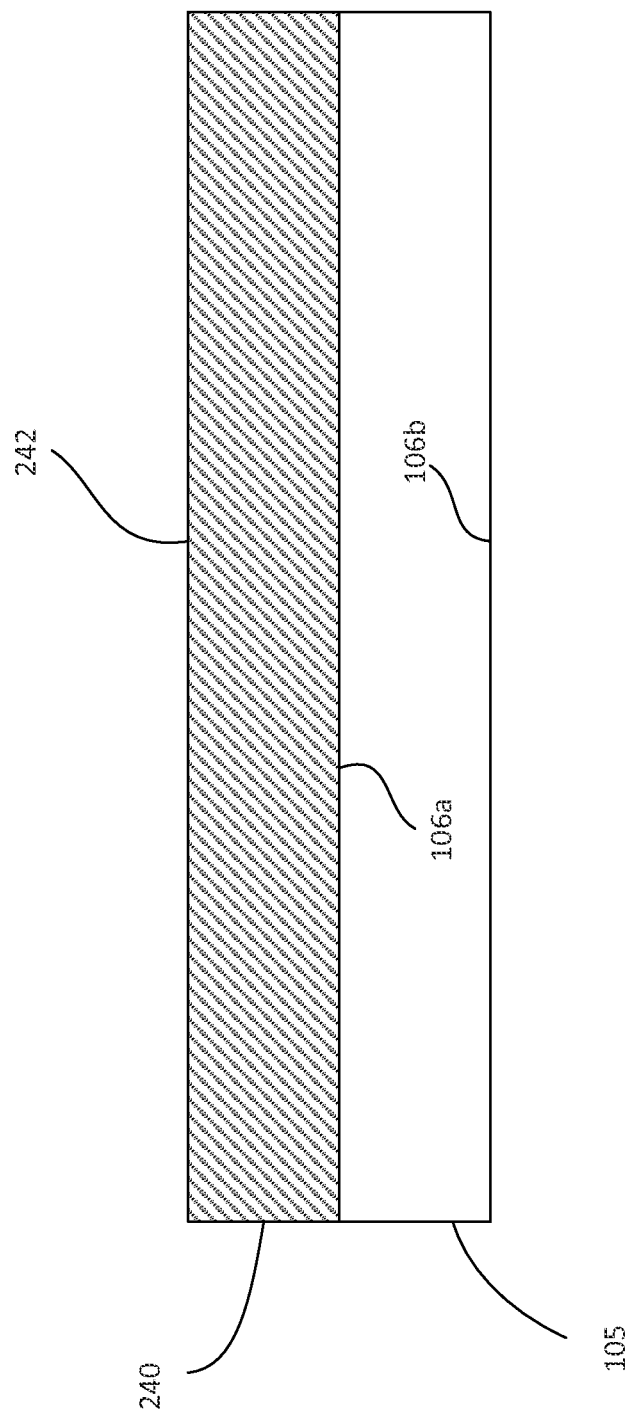

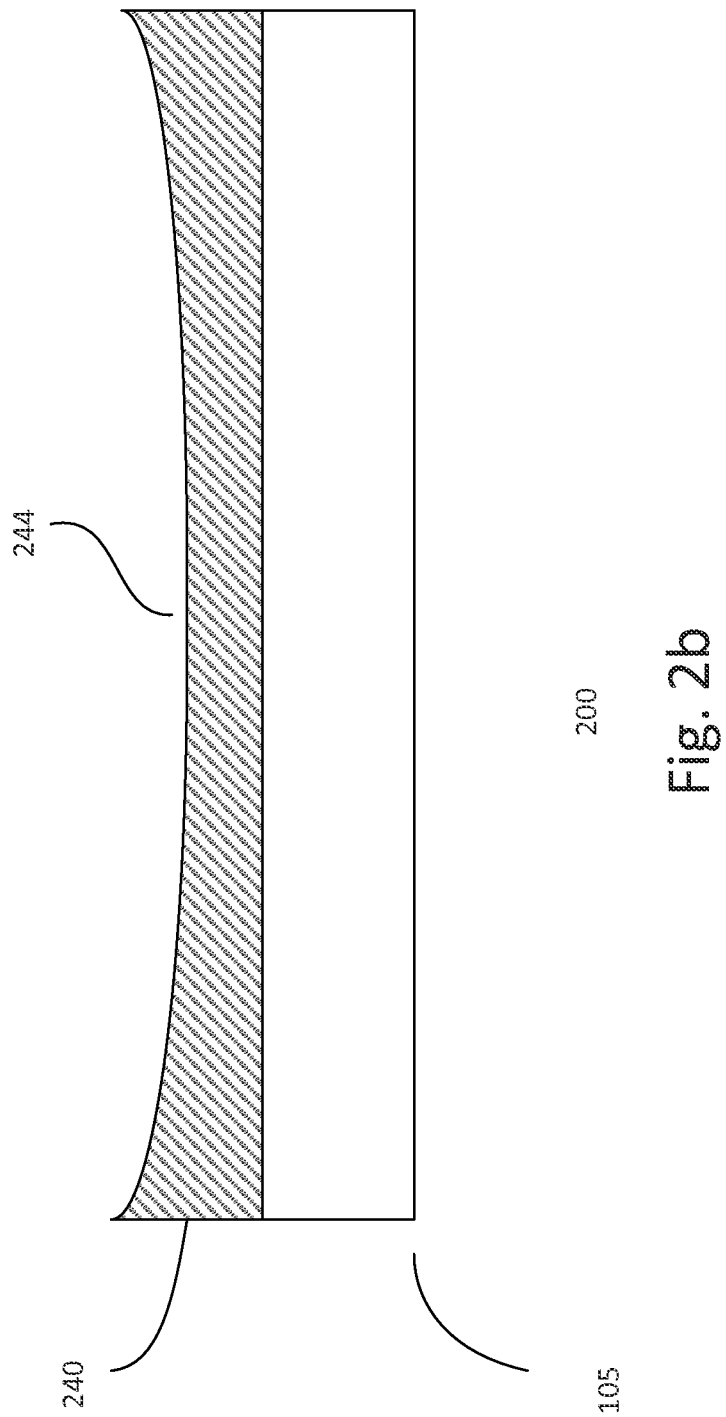

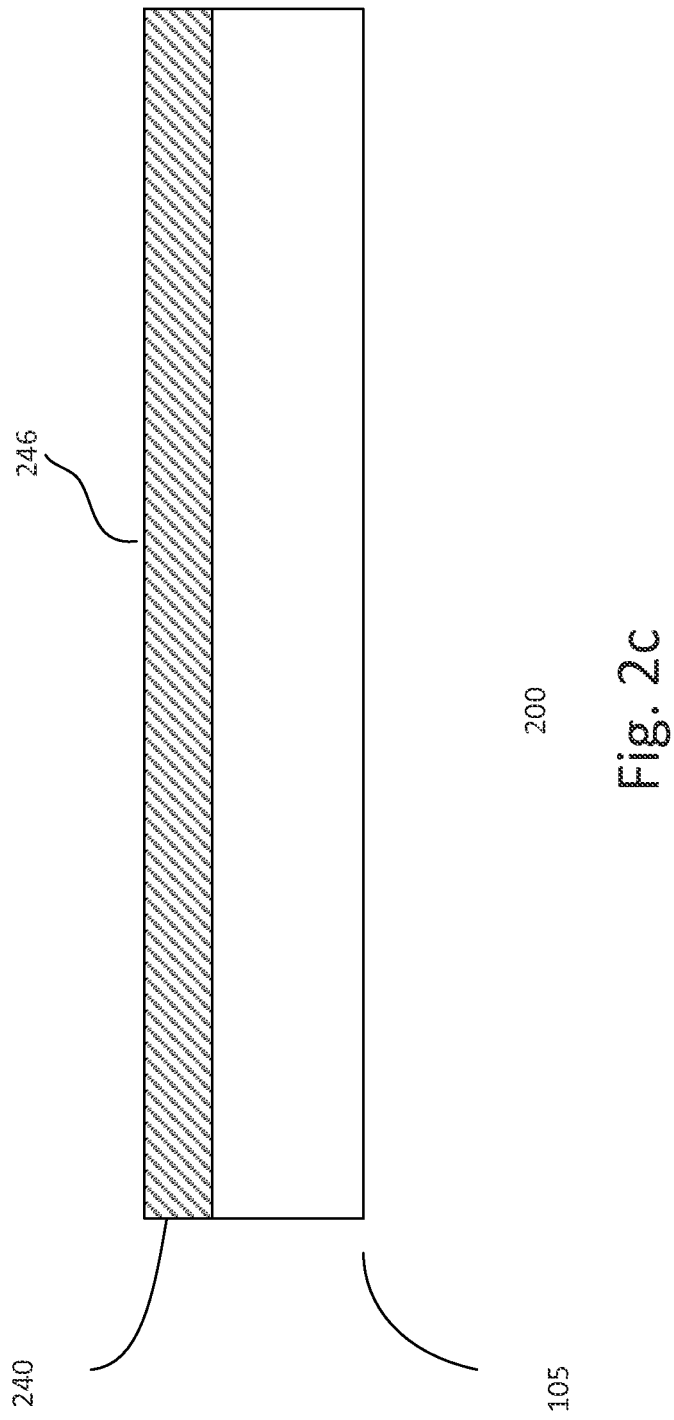

CMP WAFER EDGE CONTROL OF DIELECTRIC

BACKGROUND

Integrated circuits (ICs) are generally fabricated in parallel on a semiconductor wafer. For example, numerous ICs are formed on a wafer, such as a 300 mm wafer. Numerous processes are performed in forming the ICs. For example, the wafer may be subjected to repeated deposition, lithographic, etch, and planarization processes in forming the ICs.

In particular, planarization process is important for semiconductor processing. The purpose of planarization is to produce a planar surface, which is critical in semiconductor processing. One type of planarization process is chemical mechanical polishing (CMP).

However, due to underlying topography, conventional CMP processes have difficulties in producing planar surface. In particular, we have discovered that beveled wafer edge topographic effect causes pattern density impact which makes it difficult or impossible to produce a planar surface. Conventional CMP tools are unable to compensate for this pattern density impact. Non-planar surface causes defocus issues as well as excessive erosion, negatively impacting yields.

From the foregoing discussion, the present disclosure enables CMP processes to produce a planar surface.

SUMMARY

Embodiments generally relate to semiconductor devices and methods for forming a device. In one embodiment, a method of forming a semiconductor device is presented. The method includes providing a wafer with top and bottom wafer surfaces. The wafer includes edge and non-edge regions. A dielectric layer having a desired concave top surface is provided on the top wafer surface. The method includes planarizing the dielectric layer to form a planar top surface of the dielectric layer. The desired concave top surface of the dielectric layer thicknesses compensates for different planarizing rates at the edge and non-edge regions of the wafer.

In another embodiment, a method of forming a semiconductor device is disclosed. The method includes providing a wafer with top and bottom wafer surfaces. The wafer includes edge and non-edge regions. A dielectric layer is formed on the top wafer surface and includes processing the dielectric layer to form different dielectric layer desired thicknesses at the edge and non-edge regions of the wafer. The dielectric layer is planarized to form a planar top surface of the dielectric layer. The difference in the dielectric layer desired thicknesses compensates for different planarizing rates at the edge and non-edge regions of the wafer.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 1a-1b show an embodiment of a process for forming devices; and

FIGS. 2a-2c show another embodiment of a process for forming devices.

DETAILED DESCRIPTION

Embodiments generally relate to semiconductor devices or integrated circuits (ICs). More particularly, some embodiments relate to wafer processing in forming devices. For example, the devices may be any type of devices. The devices or ICs can be incorporated into or used with, for example, consumer electronic products, such as cell phones, laptop computers and personal digital assistants (PDAs). Other types of products may also be useful.

FIGS. 1a-1b shows a simplified side view of an embodiment of a process for forming devices. The process 100, for example, illustrates processing a wafer 105 to form devices. For example, a plurality of devices or ICs are formed on the wafer in parallel. After the wafer is finished processing, it is diced to singulate the ICs or dies. The wafer, as shown, is a partially processed wafer. The wafer is a semiconductor wafer. For example, the wafer is a silicon wafer. The wafer may be a lightly doped wafer, such as a lightly p-type (p-) doped wafer. Other types of wafers such as silicon germanium or crystalline-on-insulator (COI), including silicon-on-insulator (SOI), as well as other dopant concentration and/or dopant type, may also be useful. The wafer includes first and second opposing major surfaces 106a-106b. For example, the wafer includes top and bottom wafer surfaces 106a-106b.

In one embodiment, front-end-of-line (FEOL) processing may be performed on the wafer. For example, the wafer may be processed to form transistors in device regions (not shown). Transistors, for example, may include p-type and n-type transistors. The transistors may also include dense, isolated, high voltage, intermediate voltage or low voltage transistors or devices. Other types of devices may also be formed. Isolation regions (not shown), such as shallow trench isolation regions, may be formed in the substrate for isolating the device regions.

A transistor, for example, is formed in a device region of the wafer. A transistor includes a gate stack on the substrate disposed between source/drain (S/D) regions formed in the substrate. A doped well may serve as a body of the transistor. The gate stack, for example, includes a gate electrode over a gate dielectric. The gate electrode may be a polysilicon layer while the gate dielectric may be silicon oxide. Other types of gate stacks may also be useful. The S/D regions and gate serve as contact regions. An etch stop layer may be formed on the substrate. The etch stop layer, for example, lines the gates, S/D regions and top of isolation regions.

Referring to FIG. 1a, middle-of-line (MOL) processing may be performed on the wafer. For example, a dielectric layer 140 is formed over the first wafer surface. The dielectric layer, for example, may be silicon oxide. In one embodiment, the dielectric layer is formed on the substrate, covering the transistors. The dielectric layer, for example, serves as a contact dielectric layer of which contacts or via plugs will be formed through the dielectric layer to contact the contact regions, such as the gate and S/D regions. The dielectric layer may be referred to as a premetal dielectric (PMD) layer.

In one embodiment, the dielectric layer 140 is formed by a deposition process, such as chemical vapor deposition (CVD). In one embodiment, the deposition process processes the dielectric layer to produce a top surface 142 with a concave profile. For example, the as-deposited dielectric layer 140 includes a concave profile of which the top surface of the dielectric layer bows downwards from the edges of the wafer towards the center. The height differential of the dielectric layer from edge to center (non-edge) of the wafer, in one embodiment, should be sufficient to compensate for the polishing rate differential between the two regions during polishing of the dielectric layer which will be performed later.

In one embodiment, the deposition process parameters are tailored to produce the desired concave profile for the top surface 142 of the dielectric layer. For example, to achieve the desired concave profile, the process parameters of the CVD tool can be tuned. In addition, any suitable CVD tools, including but not limited to the Applied Material's (AMAT) CVD tool, includes a faceplate. In one embodiment, the pressure, gas flow rate of the dielectric film gas and the design of the faceplate of the CVD tool which includes the number, size, density, spacing, etc. of the faceplate apertures can be tuned, varied and customized such that higher deposition rate at the edge region of the wafer while lower deposition rate at the center region of the wafer is achieved to provide the desired concave profile as shown in FIG. 1a. For example, to achieve a height differential of about 1000 Angstrom from the edge (e.g., about 147 mm from center of the wafer) to the center of the wafer, the pressure of about 1-10 Torr, gas flow rate of about 500-10000 s.c.c.m. and the faceplate having higher density, bigger and more apertures in the edge arrangement may be employed. Other suitable thickness or height differentials between the edge and center portions may also be useful, depending on die size, pattern density, wafer edge exclusion and various CMP removal profile and polishing conditions which may impact the polishing rate differential in the regions. As such, any suitable pressure, gas flow rate and design of the CVD faceplate may be used or customized to achieve the desired concave profile.

As shown in FIG. 1b, the process continues by polishing the dielectric layer having the top surface with concave profile. In one embodiment, the dielectric layer is polished by, for example, CMP. The concave profile compensates for the difference in chemical mechanical polishing (CMP) rate in the edge and non-edge regions of the wafer, producing a planar or substantially planar top surface 146 in the dielectric layer, in spite of the polishing rate difference between edge and non-edge portions as shown in FIG. 1b. Contact openings (not shown) corresponding to the contact regions is formed after polishing the dielectric layer. Suitable mask and etch techniques may be used for forming the contact openings and conductive material, such as tungsten or copper, may be provided to fill the contact openings to form the contacts or via plugs.

The process may continue to complete processing the wafer. For example, additional interconnect levels and passivation may be performed to complete processing the wafer. After the wafer is finished processing, it is diced into individual dies and packaged to form ICs or chips. Other processes may also be included.

FIGS. 2a-2c shows a simplified side view of another embodiment of a process 200 for forming devices. The process 200, for example, illustrates processing a wafer 105 to form devices. The process is similar to that described in FIGS. 1a-1b. Common elements may not be described or described in detail. The wafer, as shown, is a partially processed wafer. The wafer is a semiconductor wafer. For example, the wafer is a silicon wafer. The wafer may be a lightly doped wafer, such as a lightly p-type (p-) doped wafer. Other types of wafers may also be useful. The wafer includes first and second opposing major surfaces 106a-106b. For example, the wafer includes top and bottom wafer surfaces 106a-106b.

The wafer may be processed to include device components (not shown), such as transistors, on the first wafer surface. An etch stop layer may be formed over the substrate, for example, lining the transistor gates, S/D regions and top of the isolation regions.

Referring to FIG. 2a, middle-of-line (MOL) processing may be performed on the wafer. For example, a dielectric layer 240 is formed over the first wafer surface. The dielectric layer, for example, may be silicon oxide. In one embodiment, the dielectric layer is formed on the substrate, covering the transistors. The dielectric layer, for example, serves as a contact dielectric layer of which contacts or via plugs will be formed through the dielectric layer to contact the contact regions, such as the gate and S/D regions. The dielectric layer may be referred to as a premetal dielectric (PMD) layer.

In one embodiment, the dielectric layer may be formed by, for example, CVD. Other suitable deposition techniques may also be useful. As shown, the dielectric layer 240 is deposited with a planar or substantially planar top surface 242. It is understood that the top surface may include topography due to the underlying topography below. The topography, for example, is created by the gaps between the gates of the transistors. Furthermore, the topography may be due to bevel edge of the wafer which causes the wafer to be thinner at the edge region than the center of the wafer. For simplification, the as-deposited dielectric layer 240 covering the wafer as shown in FIG. 2a is planar or substantially planar.

In one embodiment, the process continues to process the dielectric layer 240 to form a concaved top surface 244 as shown in FIG. 2b. For example, a profile of the top surface bows downwards from the edges of the wafer towards the center. The concave profile may be achieved by an etch back process. For example, the etch back process may be tuned or adjusted to produce the desired concave profile. Processing the dielectric layer 240 to produce a concaved top surface or profile compensates for higher polishing rate at wafer edge than non-wafer edge. In one embodiment, the height differential from edge to center (non-edge) of the wafer should be sufficient to compensate for the polishing rate differential between the two regions during polishing of the dielectric layer which will be performed later.

Various etch back processes or a combination of etch processes may be employed. The etch back process may be performed, for example, on the dielectric layer 240 having a planar or substantially planar top surface that is deposited on the wafer. In one embodiment, the etch back process is a remote plasma etch back process. The plasma etch, for example, employs a fluorine (F) containing gas, such as $NF_3$. Other types of F containing gases may also be useful. The etch back process, for example, is performed in a CVD tool. Any suitable CVD tools, including but not limited to the Applied Material's (AMAT) CVD tool, which includes a remote plasma process function or which allows plasma to be channeled to the CVD chamber may be used to perform the etch back process.

The process parameters of the CVD tool and the design of the faceplate of the CVD tool can be tailored to form the desired concave profile. For example, the pressure, gas flow rate of the etch gas and the design of the faceplate of the CVD tool which includes the number, size, density, spacing, etc. of the faceplate apertures can be tuned, varied and customized such that lower etch rate at the edge region of the wafer while higher etch rate at the center region of the wafer is achieved to provide the desired concave profile as shown in FIG. 2b. For example, to achieve a height differential of about 1000 Angstrom from the edge (e.g., about 147 mm from center of the wafer) to the center of the wafer, the pressure of about 1-10 Torr, gas flow rate of about 500-10000 s.c.c.m. and the faceplate having higher density, bigger and more apertures in the center arrangement may be employed. Other suitable thickness or height differentials between the edge and center portions may also be useful, depending on die size, pattern density, wafer edge exclusion and various CMP removal profile and polishing conditions which may impact the polishing rate differential in the regions. As such, any suitable pressure, gas flow rate and design of the CVD faceplate may be used or tailored to achieve the desired concave profile.

In another embodiment, the etch back process includes a dry etch which is performed in an etch tool to achieve the desired concave profile. Any suitable etch tools, including but not limited to the LAM Research Corporation (LAM) etch tool may be used. The dry etch, for example, is a reactive ion etch (RIE). The dry etch employs a F containing gas, such as $CF_4$. Other suitable types of F containing gases may also be useful. In one embodiment, gas flow rate at different parts of the etch chamber can be tuned to achieve the desired profile. For example, the flow rate of the etch gas can be tuned to be higher at the non-edge portion of the wafer than the edge portion to produce the desired concave profile. For example, to achieve a height differential of about 1000 Angstrom from the edge (e.g., about 147 mm from center of the wafer) to the center of the wafer, the flow rate of the etch gas at the edge portion is about 10-1000 s.c.c.m. while the flow rate of the etch gas at the center region is much higher than at the edge portion. Other suitable flow rates of the etch gas at different regions may also be employed to achieve the desired concave profile.

Alternatively, chamber temperature at different parts of the etch chamber can be controlled to achieve the desired concave profile. For example, temperature for center and edge regions of the wafer may be separately controlled. For instance, the temperature at the edge region is about 10-100 Degrees while the temperature at the center region is much higher than at the edge region. Cooling gas such as helium (He), for example, can be controlled to cool the edge portion. In some cases, both the etch gas flow and temperature can be tuned to achieve the desired concave profile.

In another embodiment, the etch back process includes a wet etch process to achieve the desired concave profile. The wet etch, for example, is performed in a single wafer wet etch tool. Any suitable wet etch tools, including but not limited to the DNS Electronics (DNS) wet clean tool, may be used. In one embodiment, the etchant may be a hydro fluoride containing etchant, such as DHF or BHF. The nozzle for injecting the etchant is located at the center of the wafer. By tuning the wafer rotation speed and by adjusting the nozzle position, the desired concave profile can be achieved. For example, to achieve a height differential of about 1000 Angstrom from the edge (e.g., about 147 mm from center of the wafer) to the center of the wafer, the wafer rotation speed of about 100-2000 rpm may be employed. Other suitable wafer rotation speed may also be used to achieve the desired concave profile.

As shown in FIG. 2c, the process continues by polishing the dielectric layer 240 having the top surface 244 with concave profile. In one embodiment, the dielectric layer is polished by, for example, CMP. Due to the concave profile of the dielectric layer, the CMP produces a planar or substantially planar top surface 246, in spite of the polishing rate difference between edge and non-edge portions. Contact openings (not shown) corresponding to the contact regions is formed after polishing the dielectric layer. Suitable mask and etch techniques may be used for forming the contact openings and conductive material, such as tungsten or copper, may be provided to fill the contact openings to form the contacts or via plugs.

The process may continue to complete processing the wafer. For example, additional interconnect levels and passivation may be performed to complete processing the wafer. After the wafer is finished processing, it is diced into individual dies and packaged to form ICs or chips. Other processes may also be included.

As described, a dielectric layer having a top surface with concave profile is prepared or is processed before polishing the dielectric layer. The incoming concave profile for polishing is to compensate for different polishing rate at the wafer edge portion and non-wafer edge portion during polishing or CMP processing of the dielectric layer. As described with respect to FIGS. 1a-1b, the concave profile may be achieved by a deposition process while the concave profile may be achieved by an etch back process as described in FIGS. 2a-2c. In other embodiments, the concave profile can be achieved by a combination of the deposition and etch back processes as described. For example, a dielectric layer having a concave profile may first be formed by the deposition process. Then, the etch back process may be formed to achieve the desired concave profile before polishing the dielectric layer. Further, for illustration purpose, the dielectric layer as described is a contact dielectric layer of which contacts or via plugs will be formed through the dielectric layer to contact the contact regions, such as the gate and S/D regions. However, it is understood that the embodiments as described in FIGS. 1a-1b and FIGS. 2a-2c are applicable to any suitable types of dielectric layers, including but not limited to shallow trench isolation dielectric layer, inter level dielectric (ILD) layer, inter-metal dielectric (IMD) layer so long as the top surface of these dielectric layers are prepared or processed to include the desired concave profile prior to the polishing or CMP process to form a planar or substantially planar dielectric top surface.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a semiconductor device comprising:
   providing a wafer with top and bottom wafer surfaces, the wafer includes edge and non-edge regions;
   depositing a dielectric layer having a planar top surface on the top wafer surface;
   then processing the dielectric layer with the planar top surface to form a concave top surface; and
   planarizing the dielectric layer to form a planar top surface of the dielectric layer, wherein the concave top surface of the dielectric layer thicknesses compensates for different planarizing rates at the edge and non-edge regions of the wafer.

2. The method of claim 1 wherein processing the dielectric layer to form the concave top surface comprises:
performing an etch back process on the dielectric layer to form the concave top surface.

3. The method of claim 2 wherein the etch back process is a dry etch process performed in an etch chamber.

4. The method of claim 3 wherein processing the dielectric layer to form the concave top surface of the dielectric layer comprises adjusting process parameters of the etch chamber used for the etch back process such that flow rate of etch gas at the edge region of the wafer is lower while flow rate of the etch gas at the center region of the wafer is higher.

5. The method of claim 3 wherein processing the dielectric layer to form the concave top surface comprises controlling chamber temperature at different parts of the etch chamber to achieve the concave top surface.

6. The method of claim 2 wherein the etch back process is a wet etch process performed in a single wafer wet etch tool.

7. The method of claim 6 wherein processing the dielectric layer to form the concave top surface of the dielectric layer comprises adjusting process parameters of the single wafer wet etch tool used for the etch back process.

8. The method of claim 2 wherein the etch back process is a remote plasma etch back process which comprises a plasma etch performed in a CVD tool.

9. The method of claim 8 wherein the plasma etch employs a fluorine containing gas.

10. The method of claim 8 wherein processing the dielectric layer to form the concave top surface of the dielectric layer comprises adjusting process parameters of the CVD tool used for the etch back process such that the etch rate at the edge region of the wafer is lower while the etch rate at the center region of the wafer is higher.

11. The method of claim 10 wherein adjusting the process parameters comprises adjusting pressure and gas flow rate of etch gas to form the concave top surface of the dielectric layer.

12. The method of claim 10 wherein adjusting the process parameters comprises controlling temperature of center and edge regions of the wafer separately.

13. The method of claim 12 wherein the temperature for the center and edge regions of the wafer are separately controlled such that the temperature at the center region is much higher than at the edge region of the wafer.

14. The method of claim 10 wherein adjusting the process parameters comprises varying the number, size, density and arrangement of apertures of a faceplate of the CVD tool.

15. A method of forming a semiconductor device comprising:
providing a wafer with top and bottom wafer surfaces, the wafer includes edge and non-edge regions;
forming a dielectric layer having a planar top surface on the top wafer surface;
then processing the dielectric layer with the planar top surface to form different dielectric layer desired thicknesses at the edge and non-edge regions of the wafer; and
planarizing the dielectric layer to form a planar top surface of the dielectric layer, wherein the difference in the dielectric layer desired thicknesses compensates for different planarizing rates at the edge and non-edge regions of the wafer.

16. The method of claim 15 wherein the thickness differential of the dielectric layer at the edge and non-edge regions of the wafer forms a concave profile of which the top surface of the dielectric layer bows downward from the edge region to the non-edge region of the wafer.

17. The method of claim 16 wherein the concave profile is achieved by performing an etch back process on the dielectric layer.

18. The method of claim 17 wherein the etch back process is a remote plasma etch back process which comprises a plasma etch performed in a CVD tool, and wherein the plasma etch employs a fluorine containing gas which comprises $NF_3$.

19. The method of claim 17 wherein processing the dielectric layer comprises-adjusting process parameters of the etch back process such that the etch rate at the edge region of the wafer is lower while the etch rate at the non-edge region of the wafer is higher.

20. The method of claim 19 wherein the etch back process is a remote plasma etch back process which comprises a plasma etch performed in a CVD tool, and wherein adjusting the process parameters comprises varying the number, size, density and arrangement of apertures of a faceplate of the CVD tool.

21. The method of claim 20 wherein the faceplate is configured with higher density, bigger and more apertures in center arrangement of the faceplate.

* * * * *